(12) United States Patent
Han (10) Patent No.: US 7,582,504 B2
(45) Date of Patent: Sep. 1, 2009

(54) CMOS IMAGE SENSOR AND METHOD FOR MANUFACTURING THE SAME

(75) Inventor: Chang Hun Han, Icheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 372 days.

(21) Appl. No.: 11/319,596

(22) Filed: Dec. 29, 2005

(65) Prior Publication Data

US 2006/0145211 A1 Jul. 6, 2006

(30) Foreign Application Priority Data

Dec. 30, 2004 (KR) .................... 10-2004-0116520

(51) Int. Cl.
*H01L 21/00* (2006.01)
*H01L 31/062* (2006.01)
*H01L 31/113* (2006.01)

(52) U.S. Cl. ................ 438/70; 257/294; 257/E31.121

(58) Field of Classification Search ............ 438/69–72; 257/294

See application file for complete search history.

(56) References Cited

U.S. PATENT DOCUMENTS 6,379,992 B2 * 4/2002 Jo ............................ 438/70

* cited by examiner

*Primary Examiner*—W. David Coleman
*Assistant Examiner*—Daniel Luke
(74) *Attorney, Agent, or Firm*—McKenna Long & Aldridge LLP

(57) ABSTRACT

A CMOS image sensor and a method for manufacturing the same are provided, in which a nitride layer for passivation is used as a microlens to reduce topology. The CMOS image sensor includes an upper metal layer partially deposited on a dielectric layer; a first nitride layer deposited on the upper metal layer; an undoped silicon glass layer deposited on the first nitride layer and polished by chemical-mechanical polishing; color filter array elements deposited and exposed on the undoped silicon glass layer and polished by the chemical-mechanical polishing; and a second nitride layer deposited on the first nitride layer and the color filter array elements and transfer-etched after forming a sacrificial microlens on the second nitride layer.

4 Claims, 10 Drawing Sheets

CMOS IMAGE SENSOR AND METHOD FOR MANUFACTURING THE SAME

This application claims the benefit of Korean Patent Application No. 10-2004-0116520, filed on Dec. 30, 2004, which is hereby incorporated by reference for all purposes as if fully set forth herein.

BACKGROUND OF THE INVENTION

1. Field of the Invention

The present invention relates to complementary metal-oxide-semiconductor (CMOS) image sensors, and more particularly, to a CMOS image sensor and a method for manufacturing the same, in which a nitride layer for passivation is used as a microlens to reduce topology.

2. Discussion of the Related Art

FIGS. 1-6 respectively illustrate sequential process steps of a method for fabricating a CMOS image sensor according to a related art.

Figure 1:
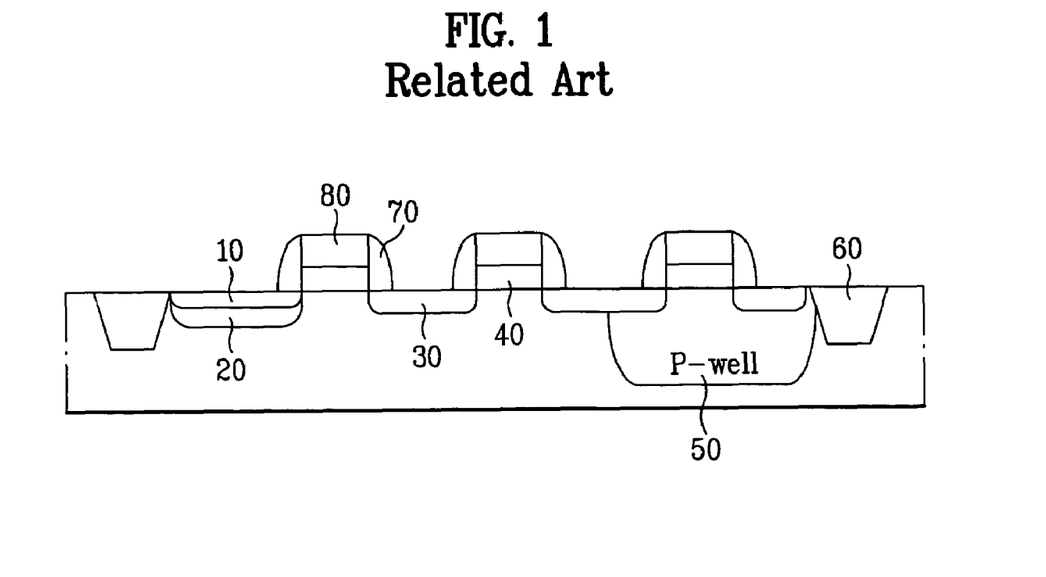
FIGS. 1-6 are cross-sectional views of a CMOS image sensor according to the related art, respectively illustrating sequential process steps of a method for fabricating the CMOS image sensor according to the related art.

FIG. 1 illustrates a unit pixel region and a peripheral region of a pad, a P-well 50 and an N-well formed by selectively implanting boron ions into a silicon substrate. A field oxide layer 60 is formed by filling a trench using a device isolation process. A gate oxide layer (not shown) is then formed at a desired thickness according to a desired threshold voltage. A polysilicon layer 40 and a tungsten silicide layer 80 to be used as a gate electrode are formed on the gate oxide layer. Then, the polysilicon layer 40 and the tungsten silicide layer 80 are selectively etched to form the gate electrode of a device. Subsequently, an N-type ion-implantation region 20 and a P-type ion-implantation region 10 are formed in the silicon substrate by selective ion implantation to form a photodiode. The wells are lightly doped to form source and drain regions of a lightly doped drain structure. A tetra-ethyl-ortho-silicate oxide layer or a silicon nitride (SiN) layer is deposited by low-pressure chemical vapor deposition. The tetra-ethyl-ortho-silicate oxide layer or the silicon nitride layer is etched back to form a spacer 70 at sidewalls of the gate electrode. Then, an N-type junction region 30 and a P-type junction region are formed by heavily doping the silicon substrate to form source and drain regions.

Figure 2:
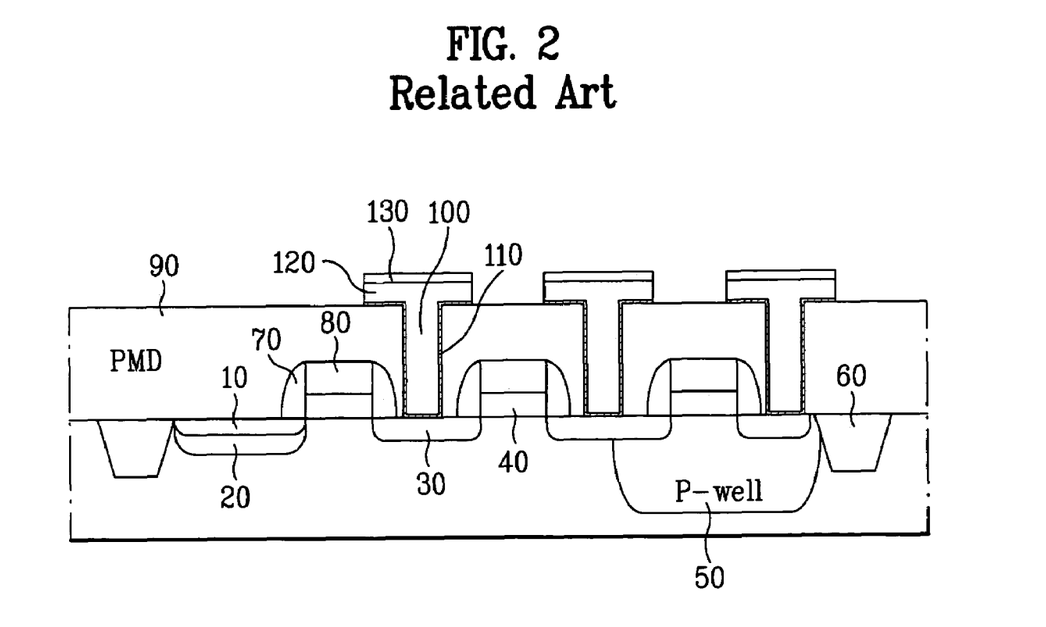

As shown in FIG. 2, the tetra-ethyl-ortho-silicate oxide layer is to be used as a pre-metal dielectric (PMD) layer 90. The PMD layer 90 is formed to a thickness of 1,000 Å by low-pressure chemical vapor deposition. A borophosphate-silicate-glass layer is formed on the tetra-ethyl-ortho-silicate oxide layer by high-pressure chemical vapor deposition. The borophosphate-silicate-glass layer then undergoes a heating process for flowing. A predetermined junction region and a contact hole 100 that exposes the gate electrode are then formed by selectively etching the PMD layer 90. Subsequently, a titanium layer 110 serving as an adhesive layer, an aluminum layer 120 for interconnection, and a non-reflective titanium nitride (TiN) layer 130 are respectively deposited and selectively etched to form a first metal line. The contact hole 100 is formed by a plasma etching process.

Figure 3:
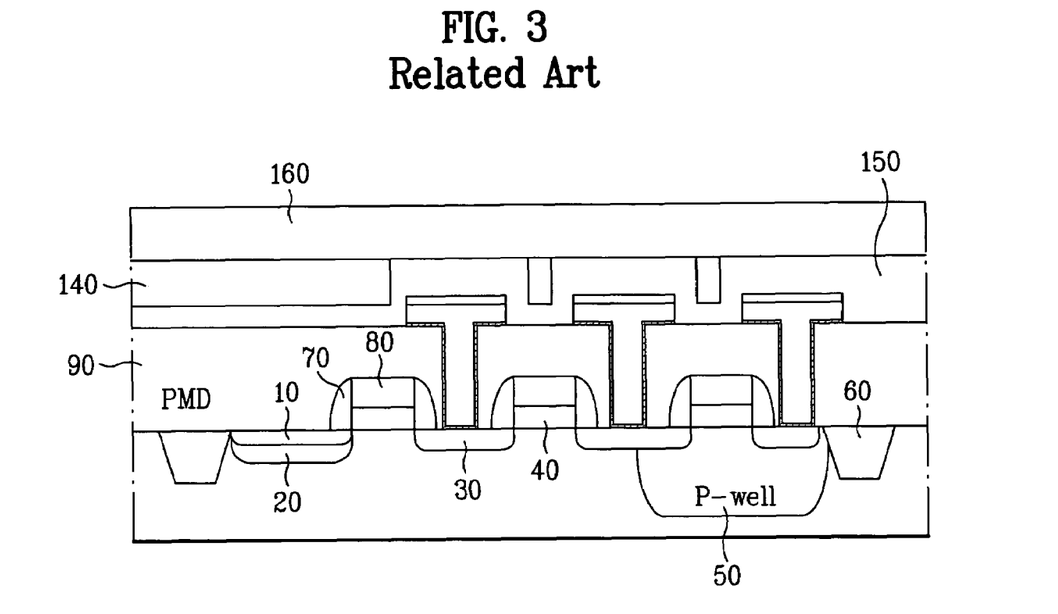

As shown in FIG. 3, a tetra-ethyl-ortho-silicate oxide layer 150 and a spin-on-glass oxide layer 140 are formed by plasma-enhanced chemical vapor deposition. Then, the tetra-ethyl-ortho-silicate oxide layer 150 and the spin-on-glass oxide layer 140 undergo a heating process and planarization. Next, an oxide layer is deposited on the tetra-ethyl-ortho-silicate oxide layer 150 and the spin-on-glass oxide layer 140 by plasma-enhanced chemical vapor deposition to form a first IMD layer 160.

Figure 4:
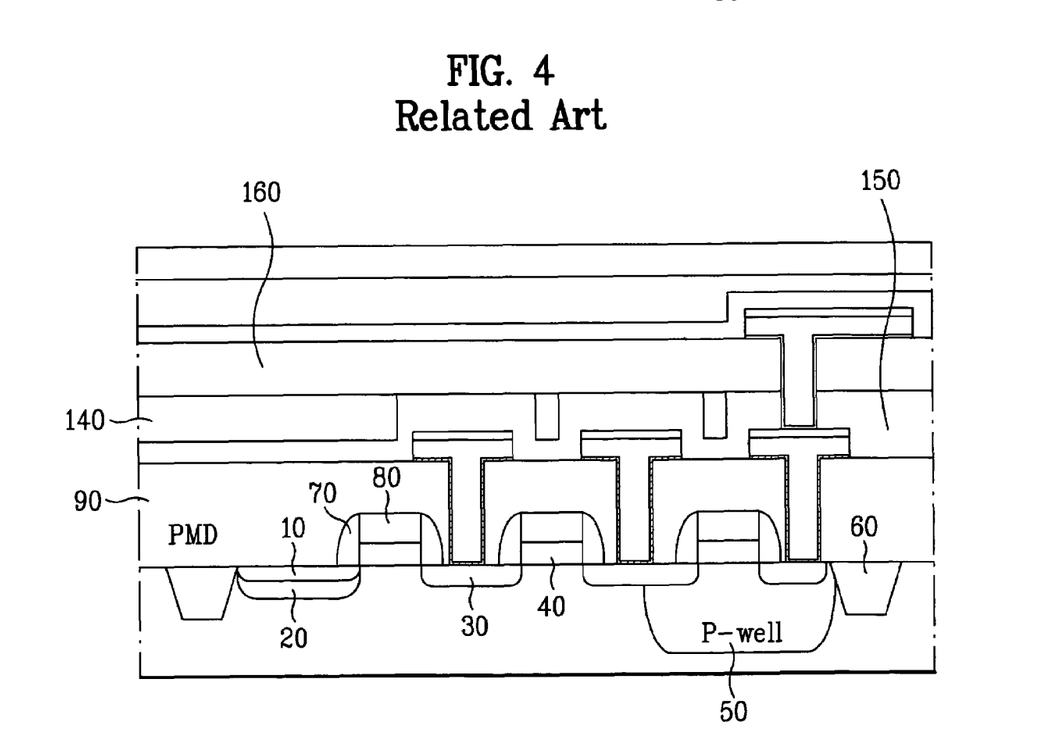

As shown in FIG. 4, a via hole is formed by selectively etching the first IMD layer 160. A titanium layer, the aluminum layer, and the titanium nitride layer are deposited and etched by the plasma etching process to form a second metal line. Subsequent formations of another tetra-ethyl-ortho-silicate oxide layer, another spin-on-glass oxide layer, and another oxide layer are formed in the same manner as the first IMD layer 90 to form a second PMD layer. The above steps are repeated according to the required number of metal line layers.

Figure 5:
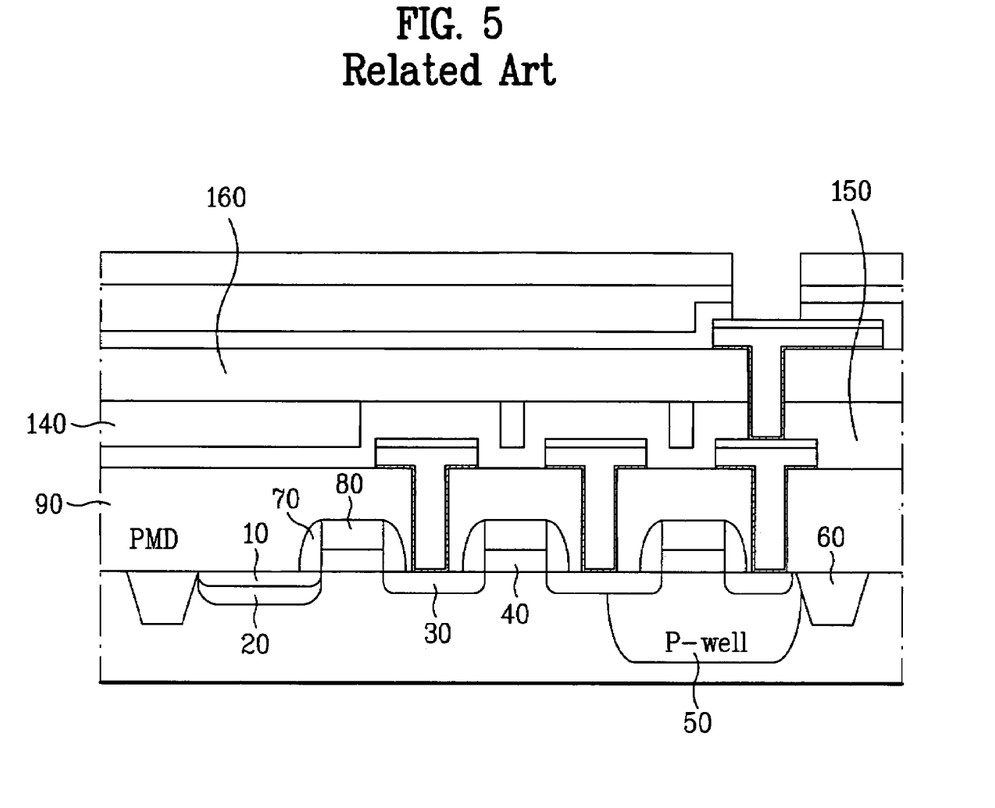

As shown in FIG. 5, after the uppermost metal line layer is formed, an oxide layer serving as a device passivation layer is deposited at a thickness of 8,000 Å by plasma-enhanced chemical vapor deposition. A metal layer around a pad area is exposed by a pad opening process so that the metal pad may be used as an electrode terminal. That is, the oxide layer for the device passivation layer and the titanium nitride layer are etched to form a pad opening.

Figure 6:
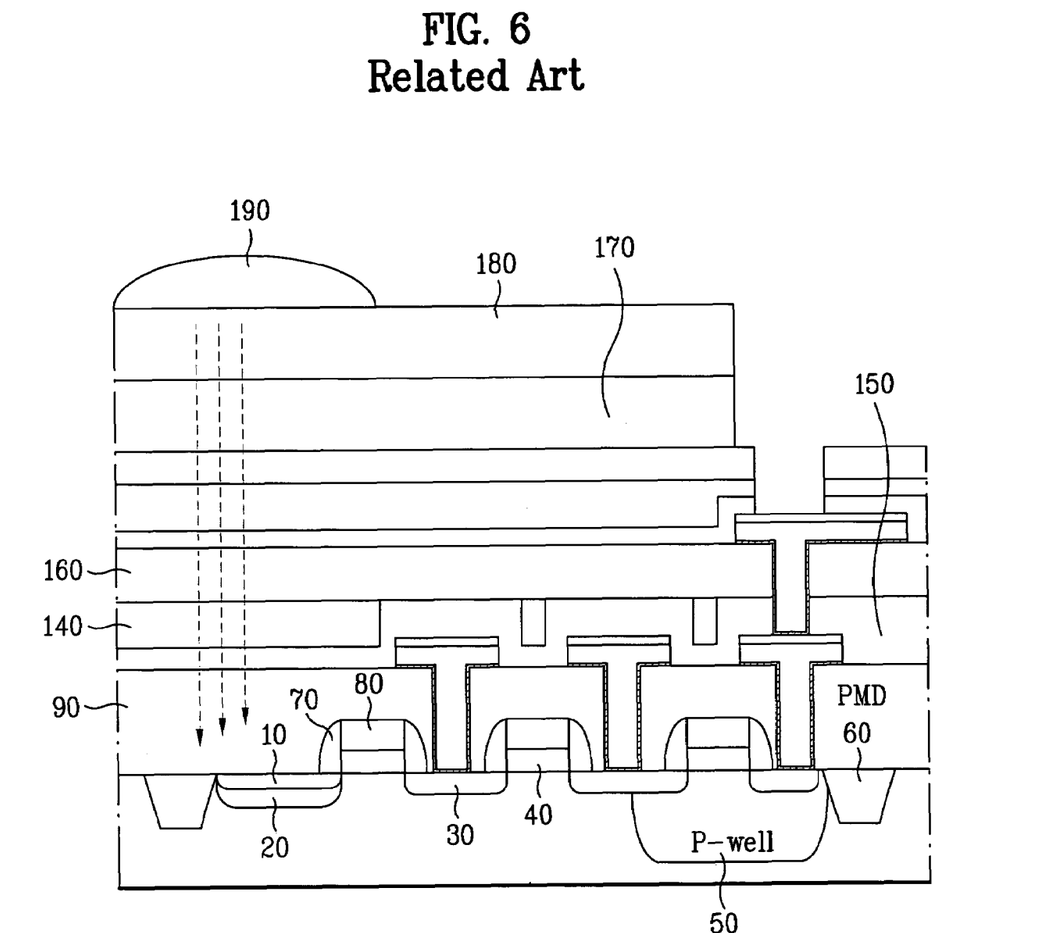

As shown in FIG. 6, a color filter array layer 170 is formed. A planarization layer 180 is formed thereon. Then, a microlens layer 190 is formed on the planarization layer 180. That is, in a CMOS image sensor according to the related art as described above, the color filter array and microlens layers are formed after the formation of the oxide layer for passivation. However, this results in a topology of the manufactured device that is too great to obtain a high quality image.

SUMMARY OF THE INVENTION

Accordingly, the present invention is directed to a CMOS image sensor and a method for manufacturing the same, which substantially obviate one or more problems due to limitations and disadvantages of the related art.

An advantage of the present invention is to provide a CMOS image sensor and a method for manufacturing the same, which reduces topology by employing a nitride layer for passivation as a microlens.

Additional features and advantages of the invention will be set forth in the description which follows, and in part will be apparent from the description or may be learned by practice of the invention. The objectives and other advantages of the invention will be realized and attained by the structure and method particularly pointed out in the written description and claims hereof as well as the appended drawings.

To achieve these and other advantages and in accordance with the purpose of the invention, as embodied and broadly described herein, there is provided a CMOS image sensor comprising an upper metal layer partially deposited on a dielectric layer; a first nitride layer deposited on the upper metal layer; an undoped silicon glass layer deposited on the first nitride layer and polished by chemical-mechanical polishing; color filter array elements deposited and exposed on the undoped silicon glass layer and polished by the chemical-mechanical polishing; and a second nitride layer deposited on the first nitride layer and the color filter array elements and transfer-etched after forming a sacrificial microlens on the second nitride layer.

In another aspect of the present invention, there is provided a method for manufacturing a CMOS image sensor comprising partially depositing an upper metal layer on a dielectric layer; depositing a first nitride layer on the upper metal layer; defining the upper metal layer and depositing an undoped silicate glass layer on the first nitride layer; depositing color filter array elements between two adjacent patterns of the undoped silicate glass layer and exposing the color filter array elements; removing the undoped silicate glass layer deposited on the first nitride layer and portions of the color filter array elements higher than the first nitride layer by chemical-mechanical polishing; depositing a second nitride layer after performing the chemical-mechanical polishing; forming a sacrificial microlens on the second nitride layer; and shaping the second nitride layer as the sacrificial microlens by a transfer etching that exposes portions of the first nitride layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

FIGS. 7-16 respectively illustrate sequential process steps of a method for fabricating a CMOS image sensor according to the present invention.

Figure 7:
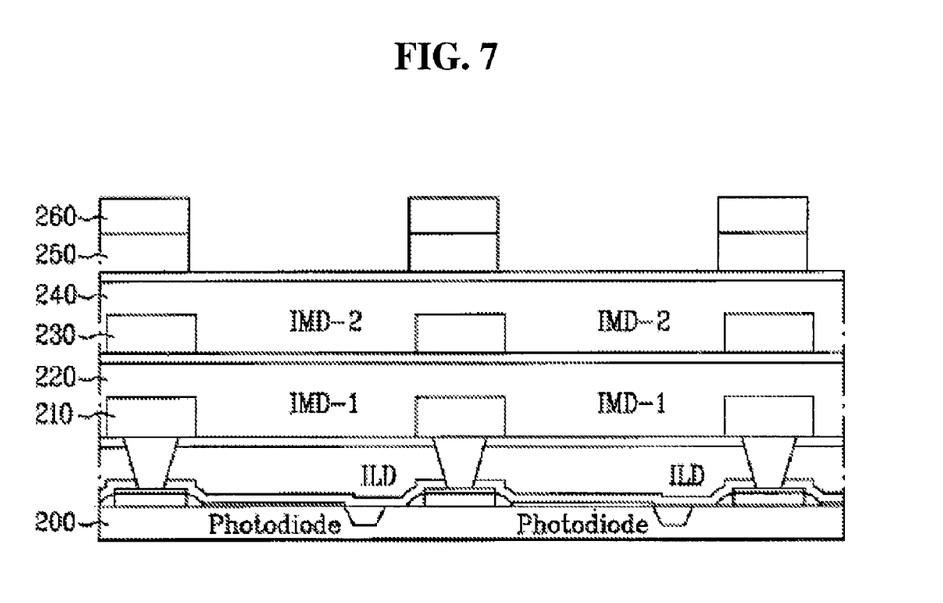
FIGS. 7-16 are cross-sectional views of a CMOS image sensor according to the present invention, respectively illustrating sequential process steps of a method for fabricating the CMOS image sensor according to the present invention.

As shown in FIG. 7, a photodiode 200 is formed. An interlayer dielectric (ILD) layer is formed on the photodiode 200. A first metal layer 210 and a second metal layer 230 are sequentially formed on the ILD layer. A first inter-metal dielectric (IMD-1) layer 220 is formed between the first metal layer 210 and the second metal layer 230. A second inter-metal dielectric (IMD-2) layer 240 is formed on the second metal layer 230. An upper metal layer 250 is partially deposited on the second IMD-2 layer 240. Two upper metal layers 250 are deposited in FIG. 7.

As shown in FIG. 7, a first nitride layer 260 is respectively deposited on the upper metal layer 250. As shown, the first nitride layer 260 is respectively deposited on the two upper metal layers 250 deposited in FIG. 7.

Figure 8:
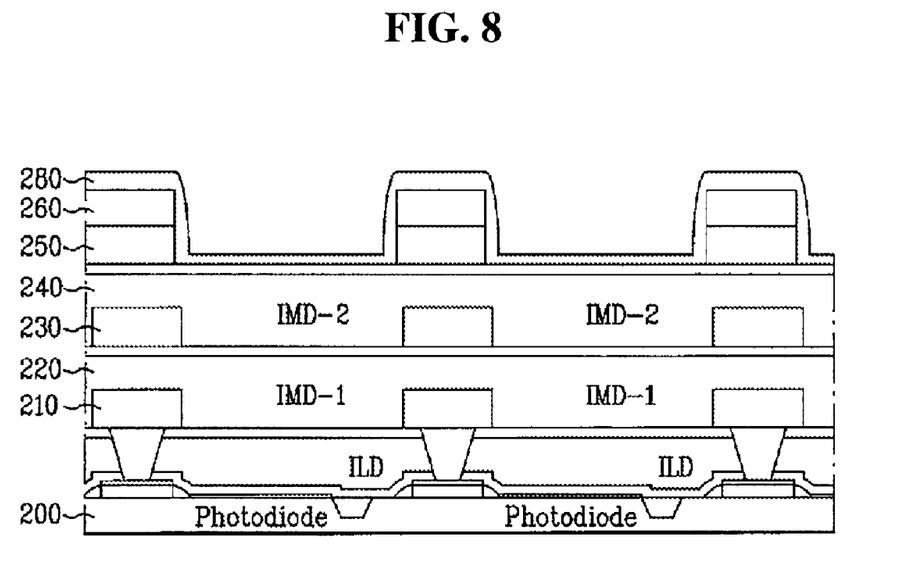

As shown in FIG. 8, the upper metal layer 250 is defined, and an undoped silicate glass layer or an undoped silicon glass layer 280 is deposited on the first nitride layer 260. The third process of the CMOS image sensor is performed for the first nitride layer 260 deposited on the upper metal layer 250.

Figure 9:
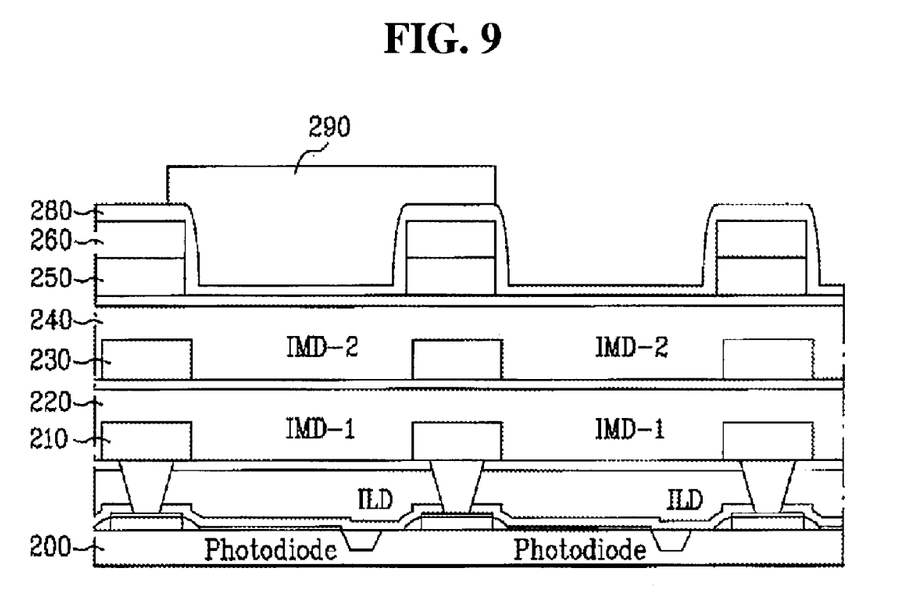

As shown in FIG. 9, a first color filter array element 290 is deposited between two adjacent patterns of the undoped silicate or silicon glass layer 280 and is then exposed. There is no deposition between other patterns of the undoped silicate or silicon glass layer 280.

Figure 10:
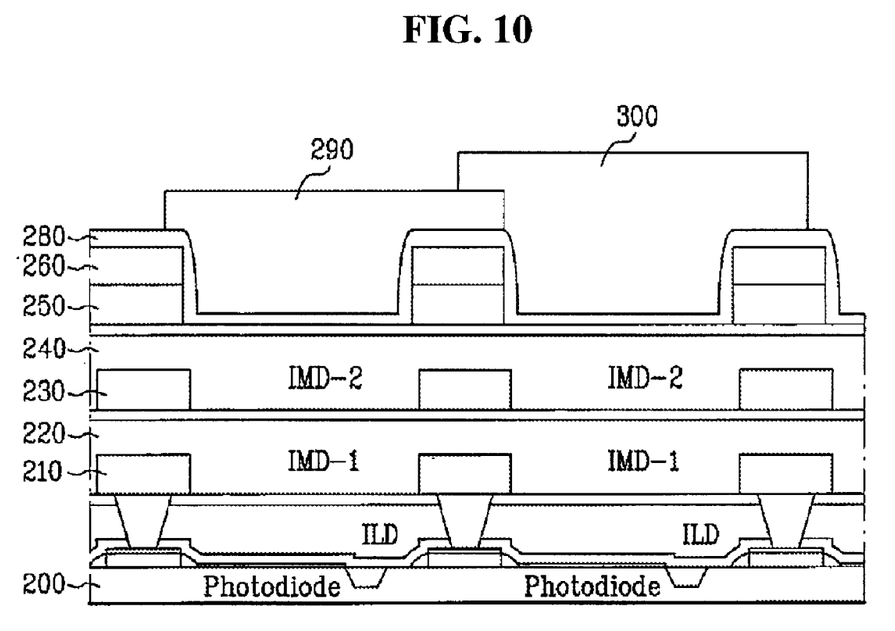

As shown in FIG. 10, a second color filter array element 300 is deposited between two other adjacent patterns of the undoped silicate or silicon glass layer 280, i.e., where there is no deposition of the first color filter array element 290, and is then exposed. Likewise, a third color filter array element (not shown) is deposited between still two other adjacent patterns of the undoped silicate or silicon glass layer 280, i.e., where there is no deposition of either of the first and second color filter array elements 290 and 300, and is then exposed.

Figure 11:
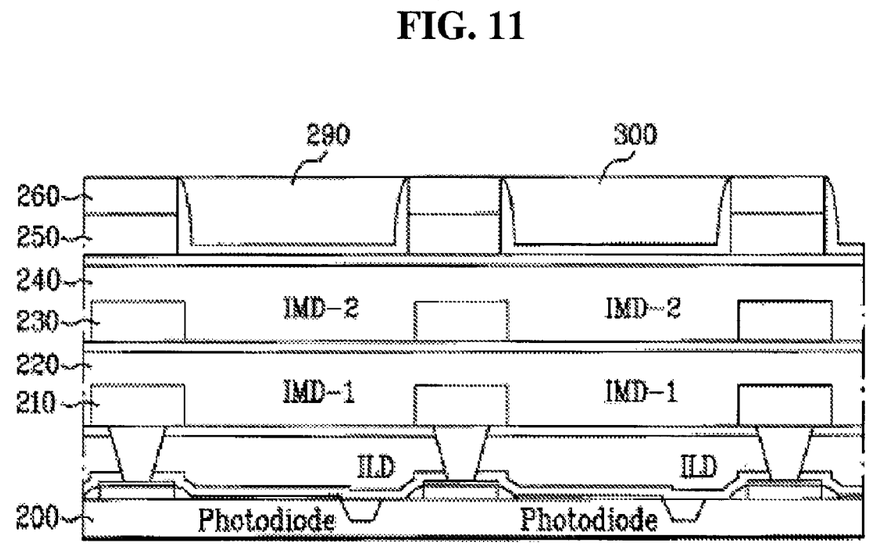

As shown in FIG. 11, the undoped silicate or silicon glass layer 280 deposited on the first nitride layer 260 and those portions of each color filter array element that extend above the upper surface of the first nitride layer are removed or planarized by chemical-mechanical polishing. Thus, the first nitride layer 260 on the upper metal layer 250 is exposed.

Figure 12:
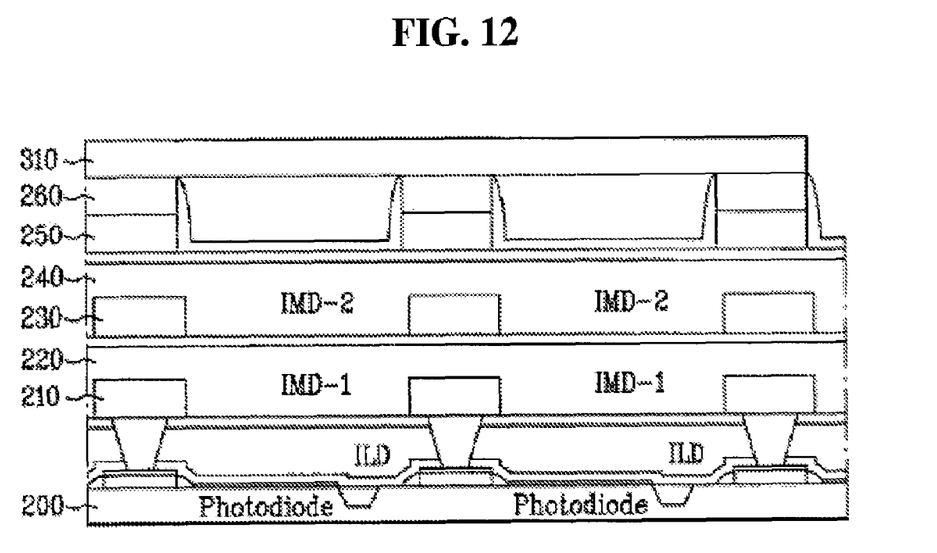

As shown in FIG. 12, after the chemical-mechanical polishing is performed, a second nitride layer 310 is deposited.

Figure 13:
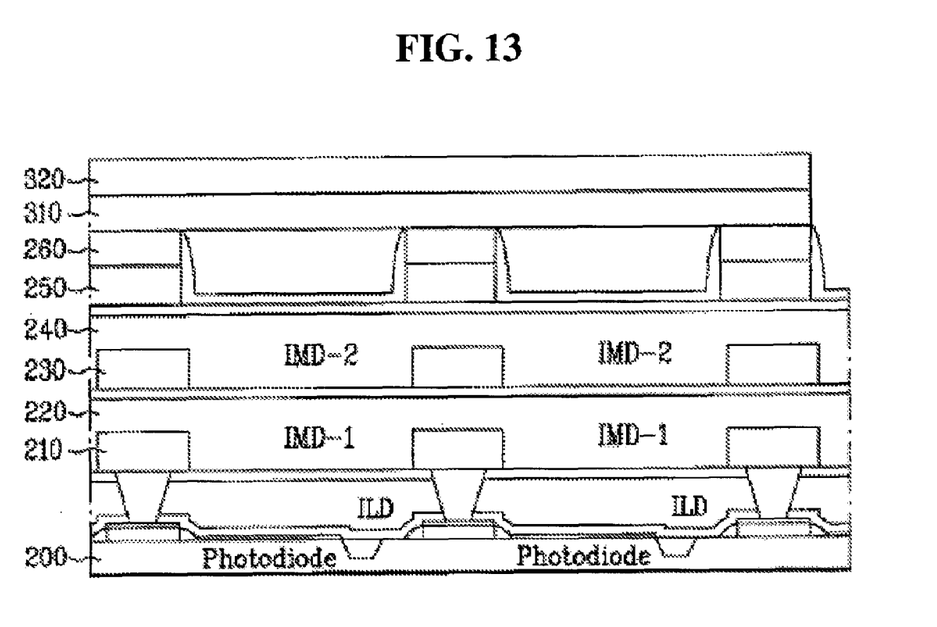

As shown in FIG. 13, a sacrificial microlens layer 320 is formed on the second nitride layer 310.

Figure 14:
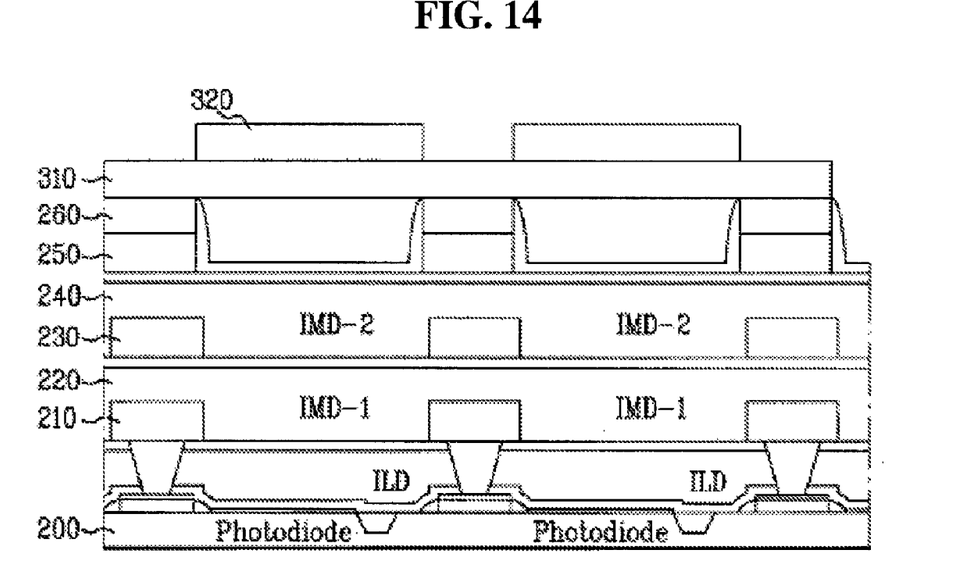

As shown in FIG. 14, the sacrificial microlens layer 320 above the first nitride layer 260 is removed from the sacrificial microlens layer 320 deposited on the second nitride layer 310.

Figure 15:
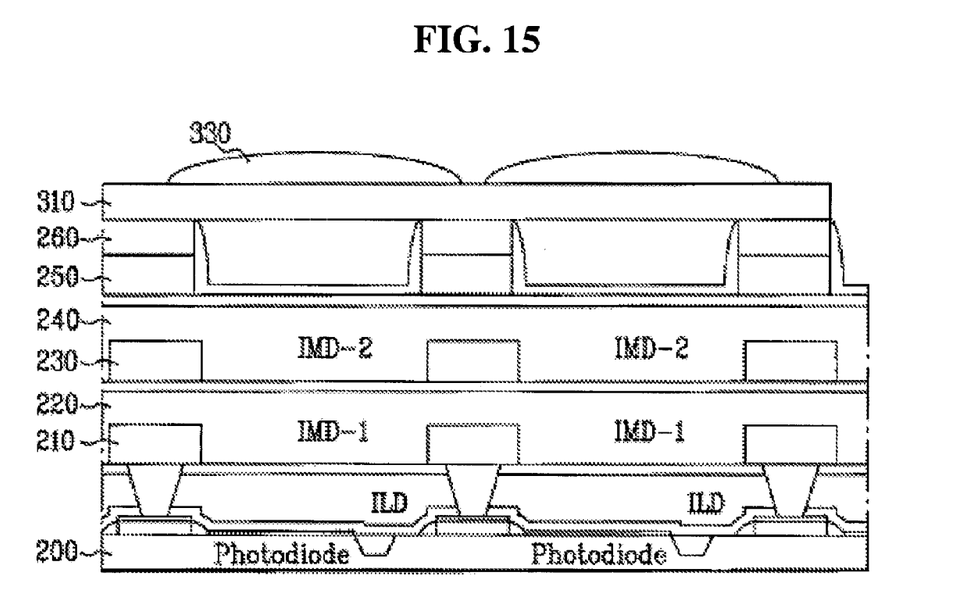

As shown in FIG. 15, a sacrificial microlens 330 is formed from the sacrificial microlens layer 320 remaining above the first nitride layer 260.

Figure 16:
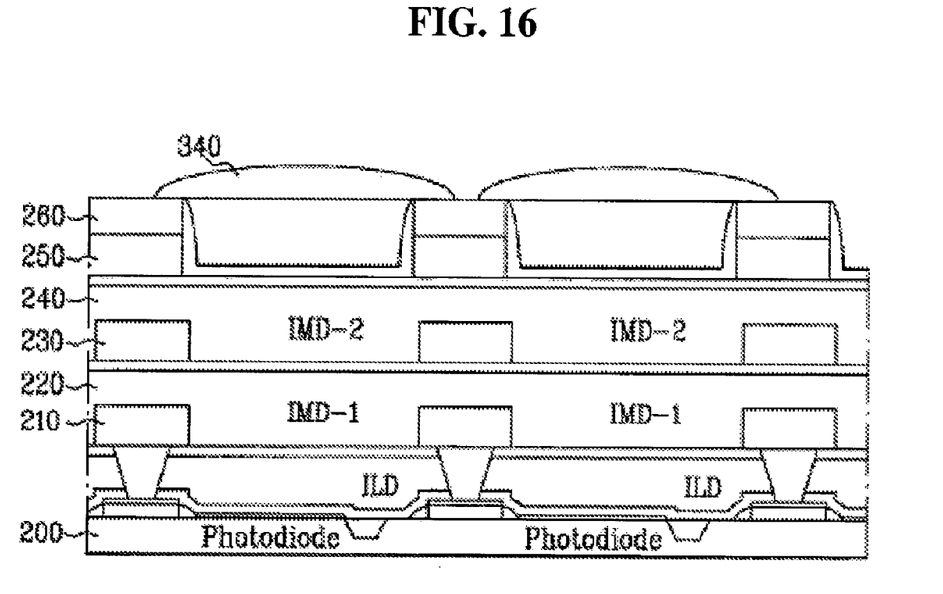

As shown in FIG. 16, a transfer etching process is performed on the sacrificial microlens 330 and the second nitride layer 310 to form the second nitride layer 310 in the same shape as the sacrificial microlens 330, thereby forming structure 340. The first nitride layer 260 is partially exposed to surround the whole pixel array. The sacrificial microlens 330 and the second nitride layer 310 are etched at a ratio of 1:1.

In the structure of a CMOS image sensor fabricated as described above, the upper metal layer 250 is partially deposited on the dielectric layer. The first nitride layer 260 is deposited on the deposited upper metal layer 250. The undoped silicate or silicon glass layer 280 is deposited on the first nitride layer 260 and polished by chemical-mechanical polishing after depositing and exposing color filter array elements. Also, the color filter array elements are deposited and exposed on the undoped silicate or silicon glass layer 280 and polished by chemical-mechanical polishing. The second nitride layer 310 is deposited on the first nitride layer 260 and the color filter array elements. The second nitride layer 310 is substantially etched away after the sacrificial microlens layer 320 is formed. Finally, the sacrificial microlens 330 is formed on the second nitride layer 310 and is then entirely removed by etching, to transfer its microlens structure to the underlying layer, i.e., the second nitride layer.

As described above, the CMOS image sensor and the method for manufacturing the same reduces topology by forming the microlenses of a nitride layer for passivation.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a CMOS image sensor, comprising:

partially depositing an upper metal layer on a dielectric layer;

depositing a first nitride layer on the upper metal layer;

patterning the upper metal layer and the first nitride layer;

forming patterns of an undoped silicate glass layer by depositing the undoped silicate glass layer on the patterned first nitride layer;

depositing color filter array elements between adjacent patterns of the undoped silicate glass layer and exposing the color filter array elements;

removing the undoped silicate glass layer deposited on the first nitride layer and portions of the color filter array elements higher than the first nitride layer by chemical-mechanical polishing;

depositing a second nitride layer after performing the chemical-mechanical polishing;

forming a sacrificial microlens on the second nitride layer; and shaping the second nitride layer as the sacrificial microlens by a transfer etching that exposes portions of the first nitride layer.

2. The method of claim 1, wherein depositing color filter array elements comprises:
   depositing a first color filter array element between a first pair of adjacent patterns of the undoped silicate glass layer and exposing the first color filter array element;
   depositing a second color filter array element between a second pair of adjacent patterns of the undoped silicate glass layer and exposing the second color filter array element; and
   depositing a third color filter array element between a third pair of adjacent patterns of the undoped silicate glass layer and exposing the third color filter array element.

3. The method of claim 1, wherein forming a sacrificial microlens comprises:
   forming a sacrificial microlens layer on the second nitride layer;
   removing the sacrificial microlens layer above the first nitride layer from the sacrificial microlens layer deposited on the second nitride layer; and
   forming a sacrificial microlens from the sacrificial microlens layer remaining above the first nitride layer.

4. The method of claim 1, wherein the transfer etching has an etching ratio of 1:1 between the sacrificial microlens and the second nitride layer.

* * * * *